United States Patent
Goldrian et al.

(10) Patent No.: US 7,961,465 B2
(45) Date of Patent: Jun. 14, 2011

(54) LOW COST LIQUID COOLING

(75) Inventors: Gottfried A. Goldrian, Boeblingen (DE); Manfred Ries, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 12/502,507

(22) Filed: Jul. 14, 2009

(65) Prior Publication Data

US 2011/0013359 A1    Jan. 20, 2011

(51) Int. Cl.
 *H05K 7/20* (2006.01)
 *F28F 7/00* (2006.01)
(52) U.S. Cl. ........ 361/699; 165/80.4; 361/702; 361/711
(58) Field of Classification Search .......... 361/688–689, 361/698–699, 702, 711
 See application file for complete search history.

(56) References Cited

U.S. PATENT DOCUMENTS

| | | | | |
|---|---|---|---|---|
| 3,364,395 | A * | 1/1968 | Donofrio et al. | 361/679.54 |
| 5,177,666 | A * | 1/1993 | Bland et al. | 361/689 |
| 5,424,916 | A * | 6/1995 | Martin | 361/698 |
| 5,801,924 | A * | 9/1998 | Salmonson | 361/719 |
| 6,577,504 | B1 | 6/2003 | Goettert | |
| 6,687,122 | B2 * | 2/2004 | Monfarad | 361/679.54 |
| 6,828,675 | B2 * | 12/2004 | Memory et al. | 257/714 |
| 7,050,299 | B2 * | 5/2006 | Kondo et al. | 361/689 |
| 2003/0128517 | A1 * | 7/2003 | Faneuf et al. | 361/704 |
| 2008/0225478 | A1 | 9/2008 | Goettert et al. | |
| 2008/0273307 | A1 * | 11/2008 | Campbell et al. | 361/699 |
| 2010/0101765 | A1 * | 4/2010 | Campbell et al. | 165/104.33 |

* cited by examiner

*Primary Examiner* — Gregory D Thompson
(74) *Attorney, Agent, or Firm* — Dennis Jung

(57) ABSTRACT

A system for cooling processor assembly is disclosed which comprises printed circuit boards (PCB) with a plurality of heat emitting electronic components, and a housing for each PCB with a heat sink covering at least partly the heat emitting electronic components. The housing comprises a base portion to which are transferred heat emitted by the electronic components. Furthermore, the system for cooling processor comprises a cooling plate on which are fixed in series the different PCBs by directly positioning the base portion of the housings onto the cooling plate. The housings for each PCB system include at their base portions clamps to be inserted into corresponding guiding holes of the cooling plate when a PCB together with its housing is positioned onto the cooling plate at a specific therefor dedicated place defined by the guiding holes. Advantageously, the PCB together with its housing is pressed against the cooling plate alongside the base portion when fixed onto the cooling plate allowing thermal coupling between the housing and the cooling plate and a hot plugging of the PCB onto the cooling plate without requiring interrupting the cooling process applied to the cooling plate.

17 Claims, 7 Drawing Sheets

LOW COST LIQUID COOLING

TECHNICAL FIELD

This invention relates to a system for cooling processor assembly comprising printed circuit boards (PCB) with a plurality of heat emitting electronic components. It is also related to an electronics rack with a plurality of such systems for cooling processor assembly and a method of cooling processor assembly.

BACKGROUND OF THE INVENTION

As computers grow in speed and shrink in size, power consumed within the computer per unit volume (power density) increases dramatically. Thus, it becomes essential to dissipate the heat generated by electronic components within the computer during operation to ensure that the components remain within their normal operating temperature ranges, since otherwise the components will fail immediately or will have a significantly shorter lifetime.

One of the most common techniques of dissipating heat from a component of a computer is to directly apply a relatively high velocity air flow across the surface of the component and heatsinks to force cooling the component. This raises the convective heat transfer coefficient for the surface of that component, thereby increasing the convection cooling. Most computers are provided with fans to promote force cooling, thus increasing the temperature differential between the surface of the component and the surrounding air to increase the efficiency of the heat transfer.

Of all components in a computer, the microprocessor central processing unit ("CPU") liberates the most heat during operation of the computer. It has therefore become common practice to provide a heatsink for the CPU to increase the heat-dissipating surface area for more effective cooling. In addition to the heat sink associated with the CPU, a dedicated CPU cooling fan is often used to provide force cooling and air exchange to dissipate the heat generated by the CPU.

Electronic racks comprising stacks of electronic system chassis or multi-blade server chassis are becoming increasingly popular. Such architecture allows to package processors along with their associated electronics in removable drawer or blade configuration disposed within a rack. In general, an electronic rack houses a plurality of thin, modular electronic printed circuit boards PCBs, possibly but not exclusively referred to as server blades. Each PCB may include one or more processors, memory, network controllers, and input/output (I/O) ports, and functions as a server, possibly dedicated to a particular application. In a mainframe environment, one does not necessarily speak of stacking of blade server chassis but the architecture is similar from the point of view of stacks of removable PCB drawers.

Blade servers or PCB drawers in some aspects offer many advantages, e.g., they contain hot-pluggable parts. The hot-plugging technique, sometimes known as hot swapping, enables the repair or replacement of computer systems without disturbing the operation of the total system, i.e., the blades or PCB can be removed without system shutdown. However, there are also disadvantages. One such disadvantage consists in the fact that cooling of these systems is very much complicated due to the amount of CPUs per rack. Thus, more and more so called hotspots, i.e., heat emitting devices share the same cooling flow, which, in general, has for a long time reached its cooling capacity.

To satisfy these increased cooling demands, cooling systems will have to be enhanced taking into account the physical coherences. Currently, the components on the blade are cooled down after a strong heating by convection of air. Due to the enormous generation of heat, air outlet temperatures of more than 50° C. with extremely high air speeds and noise emission will result. This can be controlled by placing a water cooler directly within the air flow, which deprives the strongly warmed air of heat again. Another cooling concept is the so called heat pipe technology, where chips, e.g. CPU, are connected to an air cooled heat sink by heat pipes. A typical heat pipe consists of a sealed hollow tube. A thermo conductive metal such as copper or aluminum is used to make the tube. The pipe contains a relatively small quantity of a "working fluid" or coolant with the remainder of the pipe being filled with vapor phase of the working fluid, all other gases being excluded.

On the internal side of the tube's side-walls a wick structure exerts a capillary force on the liquid phase of the working fluid. This is typically a sintered metal powder or a series of grooves parallel to the tube axis, but it may in principle be any material capable of soaking up the coolant. If the heat pipe has a continual slope with the heated end down, no inner lining is needed. The working fluid simply flows back down the pipe. This type of heat pipe is known as a Perkins Tube. The advantage of heat pipes is their great efficiency in transferring heat. They are actually a vastly better heat conductor than an equivalent cross-section of solid copper. But as the heat is finally transported to air, this technology has no principal advantages over direct air cooling.

At least in the professional field of high-performance computers, liquid cooling systems become more and more accepted, their decisive advantage being particularly their high heat intake capacity which is powers of tens higher as compared to air. With respect to blade centers or mainframe computer, two possibilities of liquid cooling can be distinguished. When using rack cooling, the air is cooled by a liquid cooled heat exchanger before the air can leave the rack, or the air is circulated inside the rack in a closed circuit cooled by a liquid cooled heat exchanger. However, this method requires a high energy and special air conditioning systems.

With direct liquid cooling, cooling liquid is directly applied to the respective heat emitting device (electronic components). There is either a single liquid circuit, or a system with primary and secondary liquid circuits. Such a system is disclosed in WO 2006/005325, the invention relating to a heat exchange system for electronic devices, preferably data processing devices, comprising high-performance processors or having high processor density. The heat exchange system comprises essentially a primary cooling circuit and a secondary cooling circuit, both being thermally associated to the one or more processor unit(s). The secondary cooling circuit is configured as a completely closed system, the coolant in the secondary cooling circuit being driven exclusively by mechanical or magnetic coupling with the flow drive of the primary cooling circuit. Such alternative has the advantage to allow hot swapping but requires very technically challenging architecture to combine a secondary cooling circuit on each PCB which makes such solution very cost-intensive. Water is circulating inside the possible blade housing and the system shows great installation height. Furthermore, defective pipes or hoses can cause outflow of water that leads to damages to the server (breakdown of the processor and damage to the electronic device, respectively).

In US 2008/0225478 is disclosed a heat exchange system for blade server systems. The heat exchange system comprises first heat sinks associated to each of said plurality of server blades, whereby the first heat sinks are adapted to collect heat emitted from heat emitting device on said associated server blade via heat pipes. The heat exchange system comprises also a liquid cooled second heat sink associated to said blade center whereby said first heat sinks are connected to the second heat sink by thermal coupling. Such solution is based on the use of heat pipes which are very cost-intensive. Furthermore, the disclosed coupling between the first and the second heat sink seems not to be reliable in a satisfactory way.

SUMMARY OF THE INVENTION

The shortcomings of the prior art are overcome and additional advantages are provided through the provision of a system for cooling processor assembly, comprising: printed circuit boards (PCB) with a plurality of heat emitting electronic components; a housing for each PCB with a heat sink covering at least partly the heat emitting electronic components while the housing comprises a base portion to which are transferred heat emitted by the electronic components; and a cooling plate on which are fixed in series the different PCBs by directly positioning the base portion of the housings onto the cooling plate. The housings for each PCB system include at their base portions clamps to be inserted into corresponding guiding holes of the cooling plate when a PCB together with its housing is positioned onto the cooling plate at a specific therefor dedicated place defined by the guiding holes. Advantageously, the PCB together with its housing is pressed against the cooling plate alongside the base portion when fixed onto the cooling plate allowing thermal coupling between the housing and the cooling plate and a hot plugging of the PCB onto the cooling plate without requiring interrupting the cooling process applied to the cooling plate.

In an embodiment according to the invention, the clamps are pressured screws protruding from the base portion of the housings and activated by a clamping mechanism comprising a lateral lever on the housing driving a pusher alongside the base portion acting on the pressured screws. The activation of the lever after positioning the PCB releases the screws pulled by some spring mechanism into the housing resulting by pressing the PCB together with its housing against the cooling plate alongside the base portion locking the PCB onto the cooling plate.

In a particularly advantageous embodiment according to the invention, the cooling plate is partly hollow with internal manifolds for a liquid coolant distribution to carry out heat transferred from the base portion of the housing to the cooling plate.

In a further embodiment, the cooling plate is constructed in a strong enough way to act as holder for the PCBs with their housings. In some alternative, the PCBs with their housings are hung in the cooling plate such that the cooling plate cools only with its bottom side. In some further alternative, the cooling plate comprises guiding holes on both sides allowing fixing in series PCBs with their respective housing on both sides.

It can be of some advantage to cover the base portion of the housing to be pressed against the cooling plate with some thermal interface material to improve the thermal coupling with the cooling plate. Also the spring mechanism pulling the screws can be constructed using a spring surrounding each screw. The pressure exerted by the base portion of the housing on the cooling plate achieved by the spring onto the screw is adaptable by adjusting the protruding height of the screws in comparison to the base portion.

The invention further relates to an electronics rack with a plurality of systems for cooling processor assembly according to present invention.

The invention also relates to a method for cooling processor assembly comprising a PCB with a plurality of heat emitting electronic components, a housing for each PCBs with a heat sink covering at least partly the heat emitting electronic components while the housing comprises a base portion with clamps to which are transferred heat emitted by the electronic components and a cooling plate. The method comprises the step of positioning the base portion of the housings in series onto the cooling plate by inserting the respective clamps into corresponding guiding holes of the cooling plate such that by pressing the PCB together with its housing against the cooling plate alongside the base portion when fixed onto the cooling plate a thermal coupling is achieved between the housing and the cooling plate. Such positioning and fixing according to the invention of the PCBs together with the respective housing onto the cooling plate allows a hot plugging of the PCB onto the cooling plate without requiring to interrupt the cooling process applied to the cooling plate.

The fixing of the PCB together with its housing on the cooling plate can be advantageously activated by some clamping mechanism via a lateral lever on the housing driving a pusher alongside the base portion acting on the clamps. The clamps are made out of pressured screws protruding from the base portion of the housings. The activation of the lever after positioning the PCB releases the screws pulled by some spring mechanism into the housing resulting by pressing the PCB together with its housing against the cooling plate alongside the base portion locking the PCB onto the cooling plate. Advantageously, some liquid coolant is distributed within the cooling plate being hollow with internal manifolds such that the liquid is carrying out heat transferred from the base portion of the housing to the cooling plate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The present invention relates to a system for cooling processor assembly. For simplification of the description of the present invention a processor node of a super computer or main frame is taken as an example of a processor assembly. Such processor node also called in a server environment blade server consists of a PCB with a plurality of heat emitting electronic components and some housing covering at least partly the heat emitting electronic components. The housing comprises a base portion to which are transferred the heat emitted by the electronic components usual when activated. Such base portion is used to be positioned on a cooling plate in such a way that a plurality of similar processor nodes with their base portion can be fixed in series.

Figure 1:
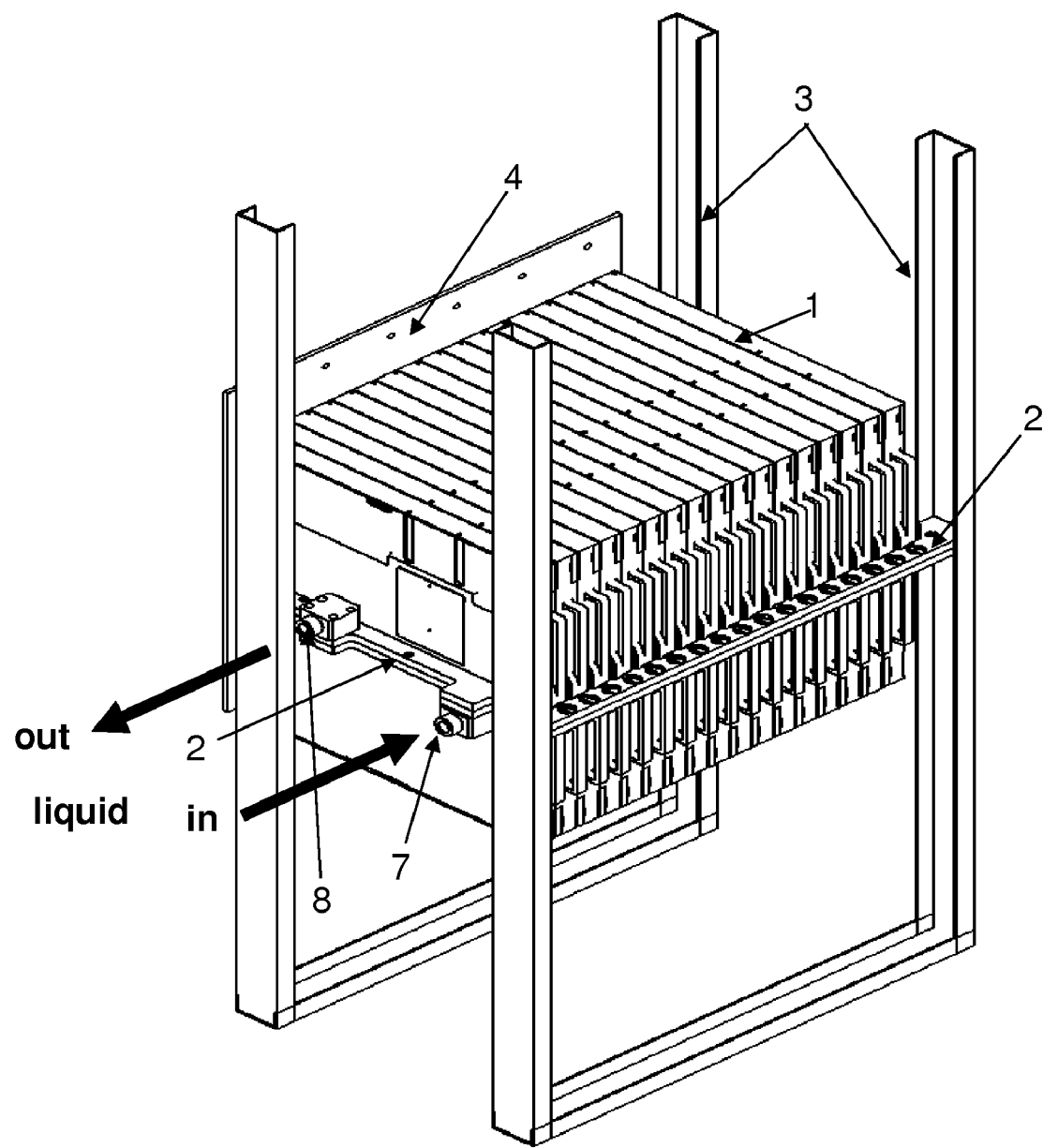
FIG. 1 illustrates a view of a rack with a processor cluster according to the invention.

FIG. 1 shows a part view of a supercomputer with a frame or rack made out of profiles 3 or hollow structural sections on which is fixed a cooling plate 2 according to the invention. A plurality of processor nodes 1 with their housing are fixed in series on the top and the bottom of the cooling plate 2 to be cooled by the cooling plate via the respective base portion of the housing. Such cooling plate can be manufactured in a strong enough way to act as a constructive element of the supercomputer i.e. a holder for the processor nodes 1. The processor nodes 1 are placed on the cooling plate in well defined position to be plugged into some common back plane 4.

As shown of FIG. 1 the cooling plate 2 is designed to be cooled using some liquid coolant to be distributed within the cooling plate 2 being partly hollow with some internal manifolds adapted for an optimized dissipation of heat. Cold liquid like water is conveyed into the cooling plate 2 at inlet connector 7 to be distributed inside via internal manifolds (not shown) before leaving it from outlet connector 8 extracting in an efficient way most of the heat which propagated from the electronic components via the housings with its base portion to the cooling plate.

The liquid cooling approach shown in FIG. 1 is very cost effective because there is no expensive Quick Connect (for liquids) required. The cooling liquid flows only in the cooling plate 2 and does not have to be interrupted when a processor node 1 has to be plugged allowing a hot-plugging. A significant cost reduction is achieved with such relative expensive cooling plate 2 used for many processor nodes 1.

Figure 2:
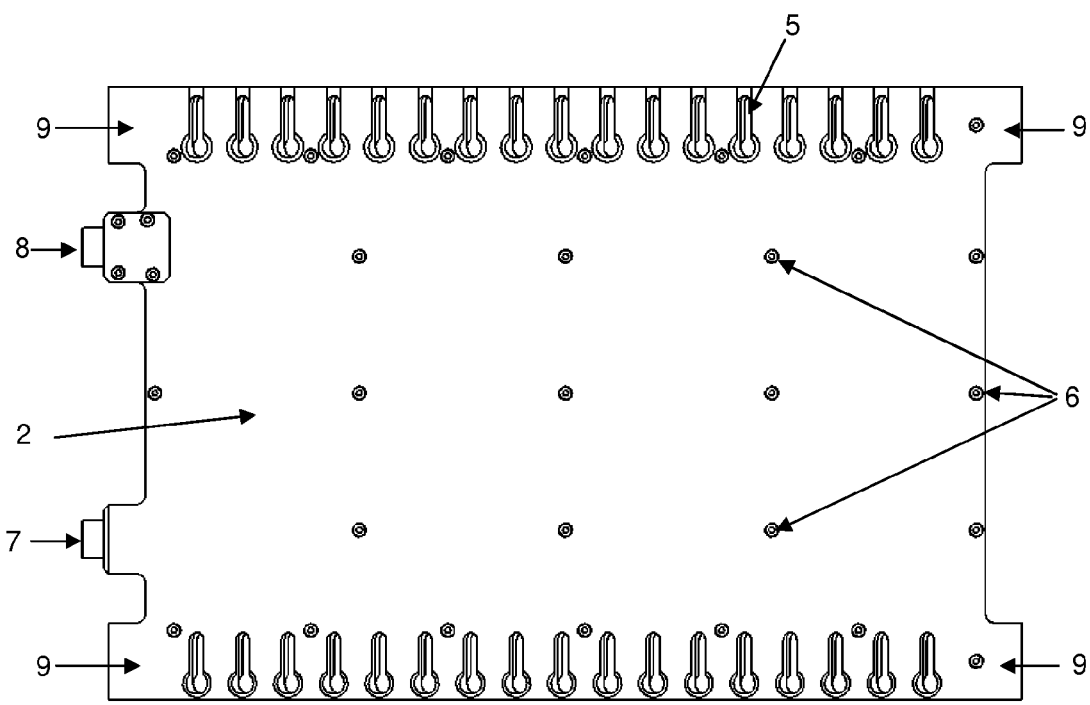
FIG. 2 illustrates a top view of a cooling plate according to the invention.

A top view of the cooling plate 2 is shown in FIG. 2. It depicts key holes 5 used to guide each processor node 1 when positioned onto the cooling plate. Usually two guiding holes 5 are assigned to each processor node 1, one from the front row and the second from the back row with respect to the super computer. Clamps of the processor nodes protruding out from the housing at its base portion are inserted into those guiding holes which define in such a way a specific dedicated place for each processor node 2. Four ends 9 of the cooling plate 2 are formed in a way to fit into the profiles 3 of the rack frame to be part of the rack. The cooling plate 2 is the mechanical mounting platform for the processor nodes 1.

The cooling plate 2 in this example is built of two halves. These halves are nearly identical. They have the same thermal conductivity to the liquid. They are bolted together with screws 6 and protected with O-rings against leakage. This construction makes the cooling plate 2 very stiff able to hold all thirty four processor nodes as shown on FIG. 1 without bending. The cooling liquid, possibly but not necessarily water, enters the cooling plate in the inlet connector 7 and exits the cooling plate 2 at the outlet connector 8. Theses two connectors are connected with the manifold of the rack which supplies in this example up to eight cooling plates with cooling liquid.

Figure 3:
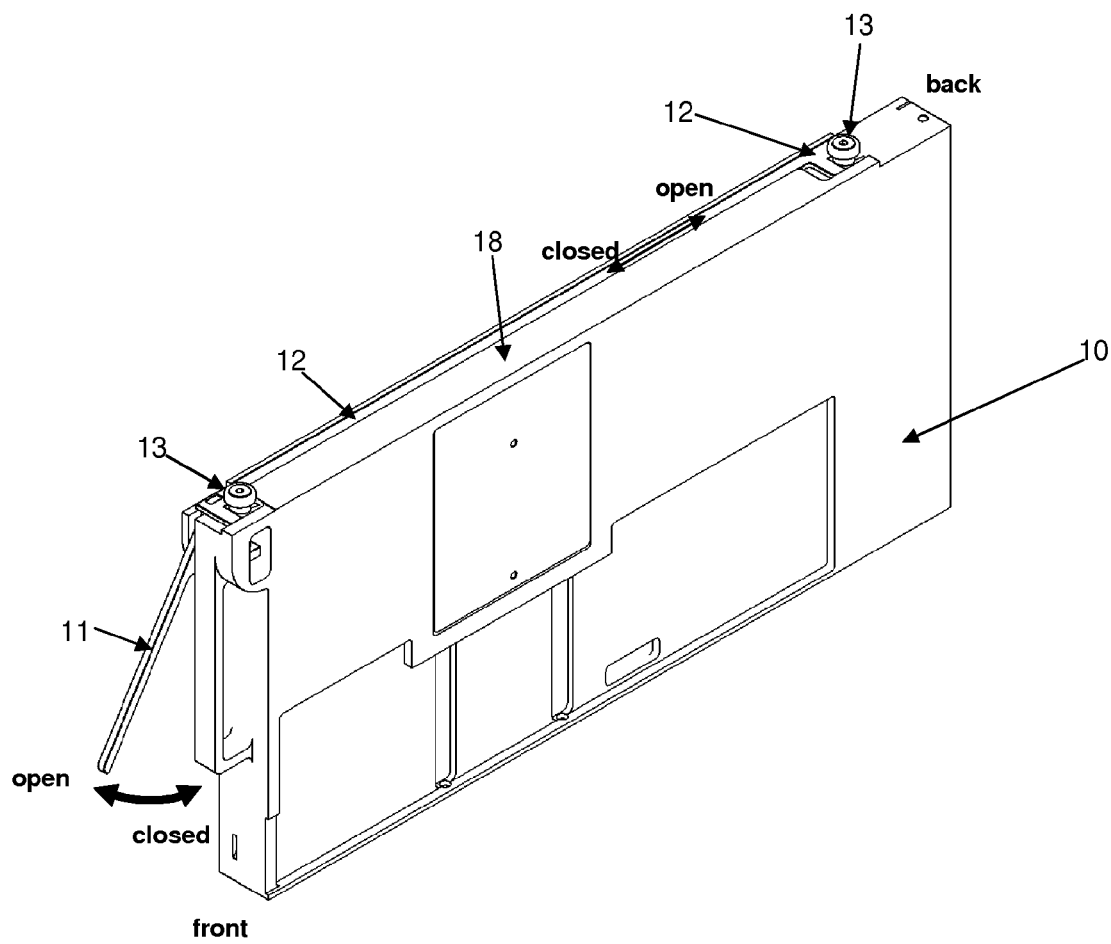
FIG. 3 illustrates a side view of a processor node with its housing according to the invention.
Figure 4A:
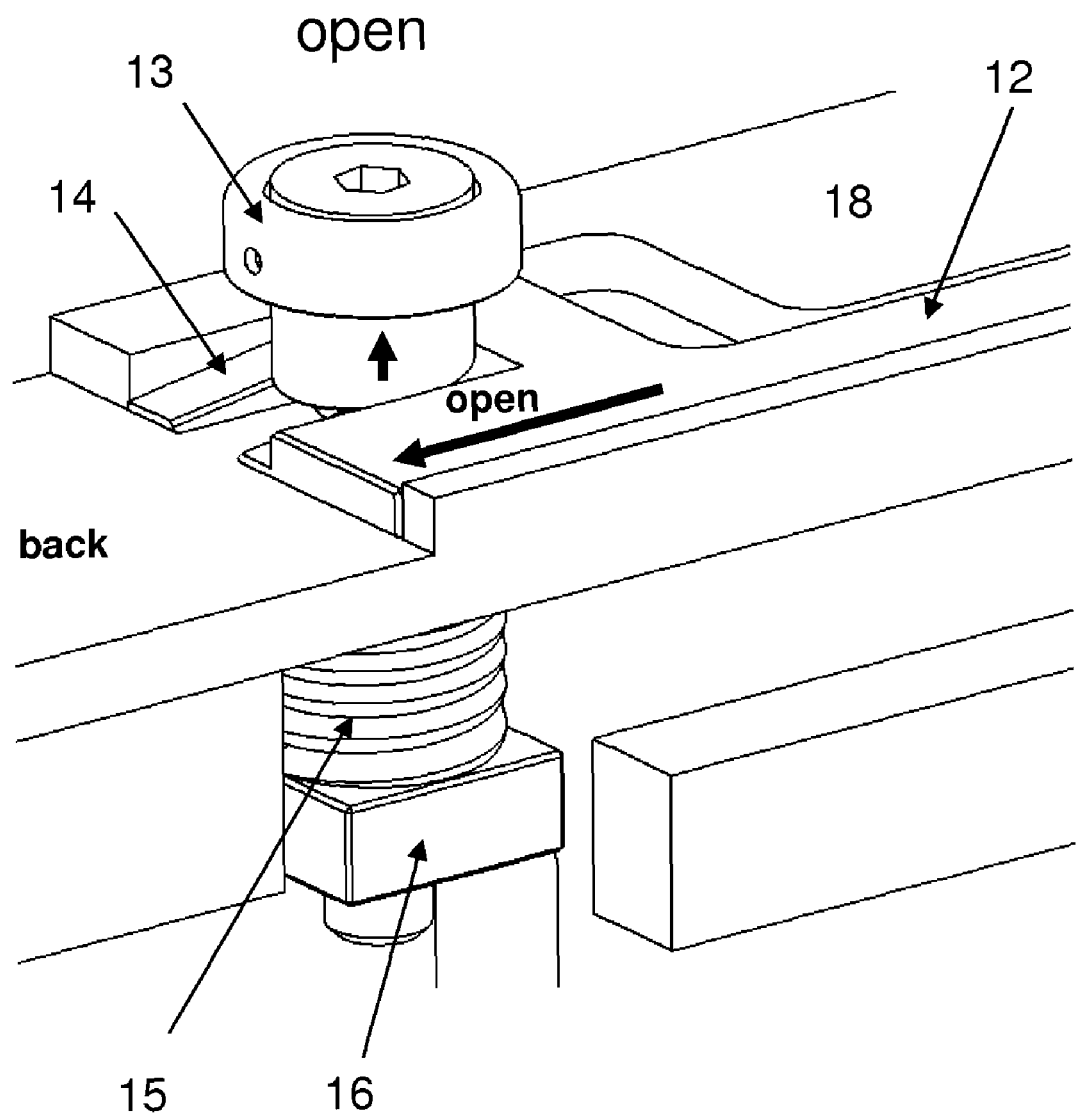
FIGS. 4A and 4B illustrate detailed views of the clamping mechanism according to the invention.
Figure 4B:
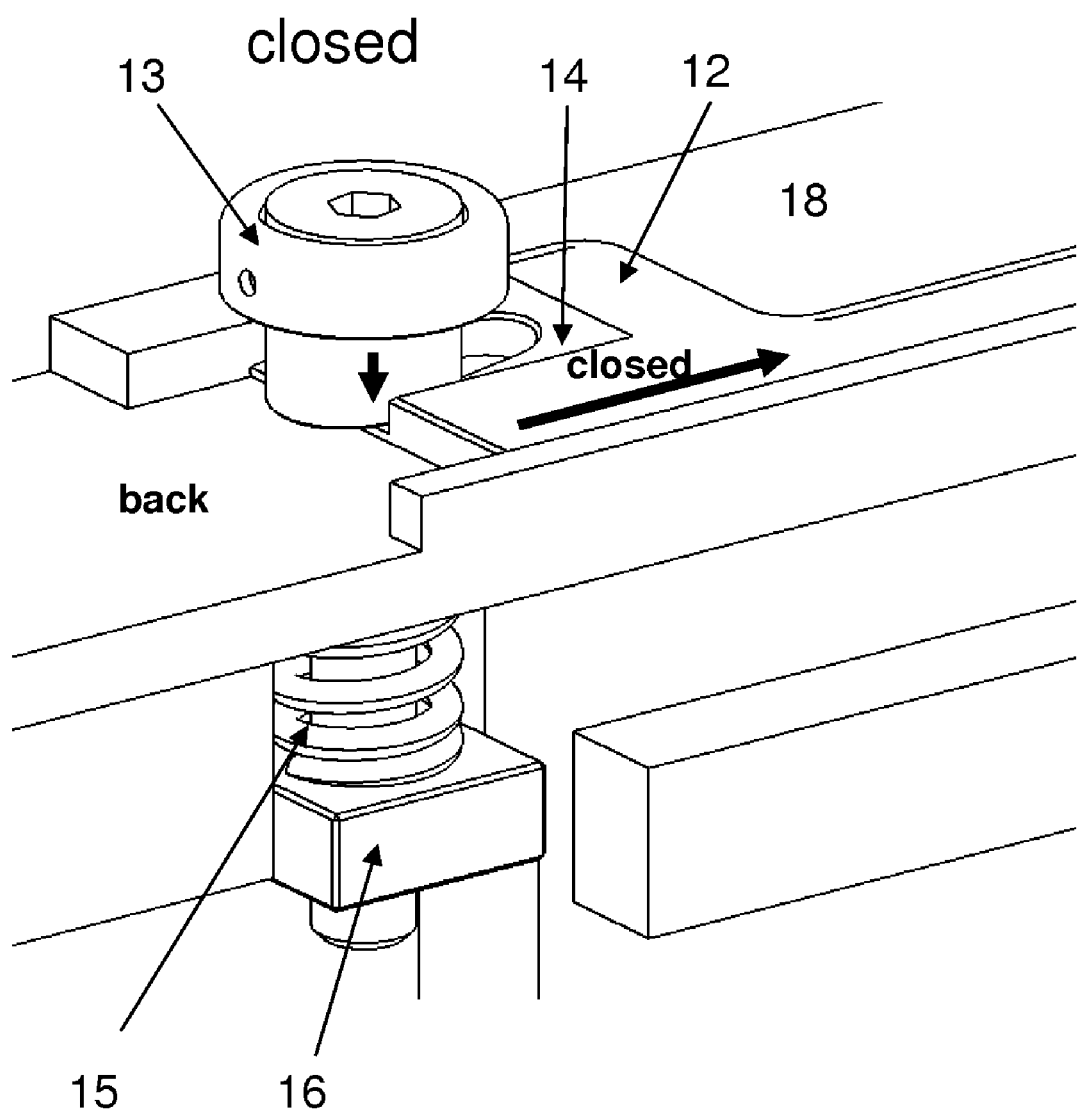

A processor node 1 with a clamping mechanism according to the invention is depicted in FIG. 3. It shows a lateral lever 11 on the housing driving a pusher 12 alongside the base portion 18 of the heat collector from a processor node 1. The pusher 12 acts on the clamps being pressured screws 13 protruding from the base portion at the front and at the back of the housing. The detailed view of the pressured screws assembly is described in FIG. 4A and FIG. 4B. The lateral lever 11 is operated from the front of the rack. It shall be in open position when a processor node 1 must be installed onto or moved out of the cooling plate 2. Once the processor node 1 is positioned at its right place by introducing the protruding screws 13 in their respective guiding holes 5 within the cooling plate 2 (see FIG. 2) then the lateral level can be pushed in direction to the back of the super computer driving at the same time the pusher 12 towards the front. This movement of the pusher 12 corresponds to withdrawing a respective wedge 14 being part of the pusher 12 away from below the pressure screws 13 freeing the screws 13 being pulled towards the base portion 18 of the heat collector by some spring mechanism. Such mechanism corresponds in the present embodiment as shown in FIG. 4A and FIG. 4B to a spring 15 surrounding the pressure screws 13, the force of the spring being adjusted by turning a nut 16 at one end of the screws 13.

In the open position the processor node 1 can be plugged and unplugged. It is free to glide on the cooling plate 2 along its base portion 18 and be removed from the super computer (hot-plugging). To plug the processor node in the super computer it has to be aligned to the cooling plate so that the two pressure screws are plugged into the round holes of the respective key holes 5 in the cooling plate 2 (see FIG. 2). The processor node 1 is pushed against the back plane to its final place. It glides on the cooling plate 2 via the pressure screws 13 guided by the holes 5 of the cooling plate 2 till reaching the card sockets (not shown) of the back plane 4. Then the lever 11 is pushed to the housing to lock the processor node on the cooling plate 2. This corresponds to the closed position. As explained above, this movement of the lever frees the pressure screws 13 causing the pressure screw 13 to be locked into the respective key holes 5 of the cooling plate due to the pulling force exerted by the springs 15 on the screws 13. This pulling force results in pressing the processor node 1 against the cooling plate 2. The pulling force can be well controlled by adjusting the nut 16 at the pressure screws 13.

Advantageously, before the processor node 1 is plugged, the surface of the base portion 18 can be covered with some Thermal Interface Material (TIM). A thin film of thermal grease on the surface of the base portion 18 is sufficient for an efficient thermal contact to the cooling plate 2. The use of a film of silicon oil has shown good results. Despite not having the thermal conductance of thermal grease, silicon oil has the advantage to be very easy to handle and cheap.

Figure 5:
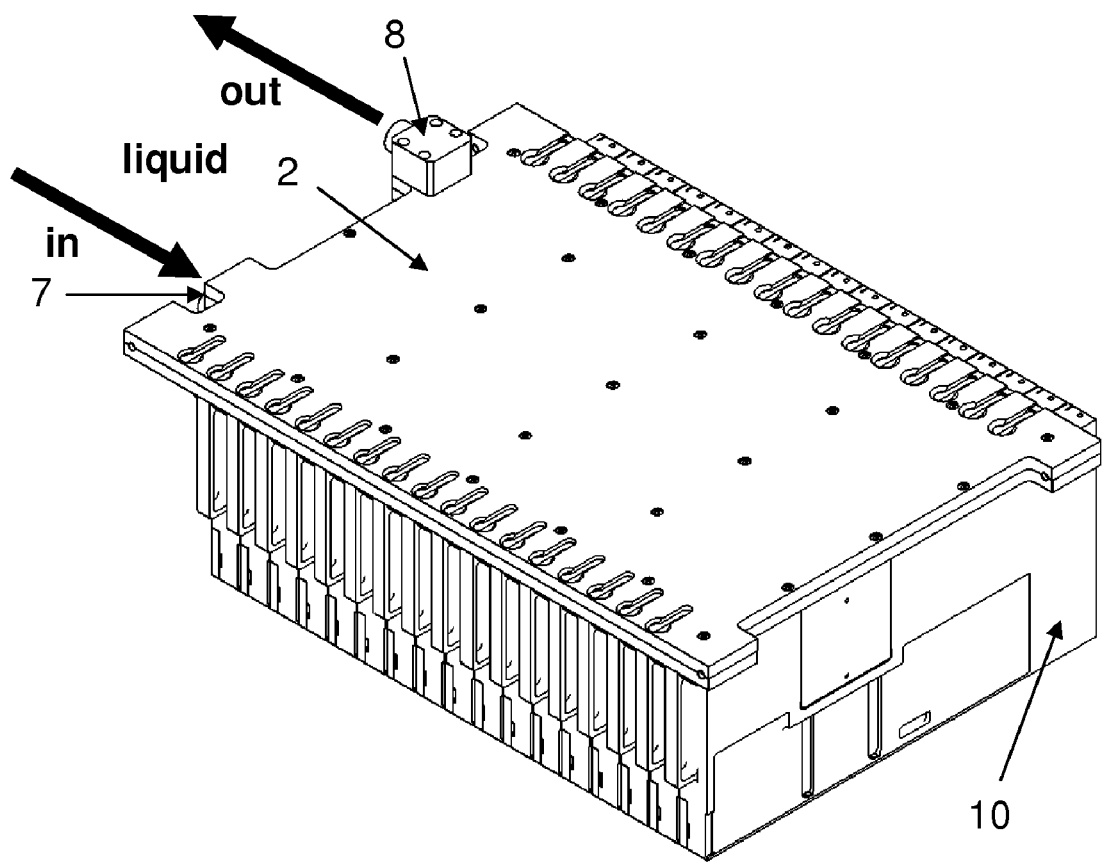
FIG. 5 illustrates a top view of a cooling plate with processor nodes according to the invention.

The present invention is especially suited for power efficient processor nodes. These are nodes with low to medium heat dissipation. Servers for general purpose computing, like Blade Servers, have typically higher power consumption. It is a factor 2 to 3 higher than the power consumption in a processor node. For such servers the cooling approach as shown in FIG. 5 is possibly better suited. Only processor systems 1 are hung from the cooling plate 2. Therefore, the cooling plate cools only with its bottom side. The heat of the servers is transferred to the cooling plate via the base portion surface 18 on the top of the respective housing 1. This arrangement allows the usage of vapour chambers and heat pipes in the server for efficient heat removal from the electronic components to the housing since gravity is supporting such heat transfer. In this case a TIM with high thermal conductivity like thermal grease is required between the server housing and cooling plate.

Figure 6:
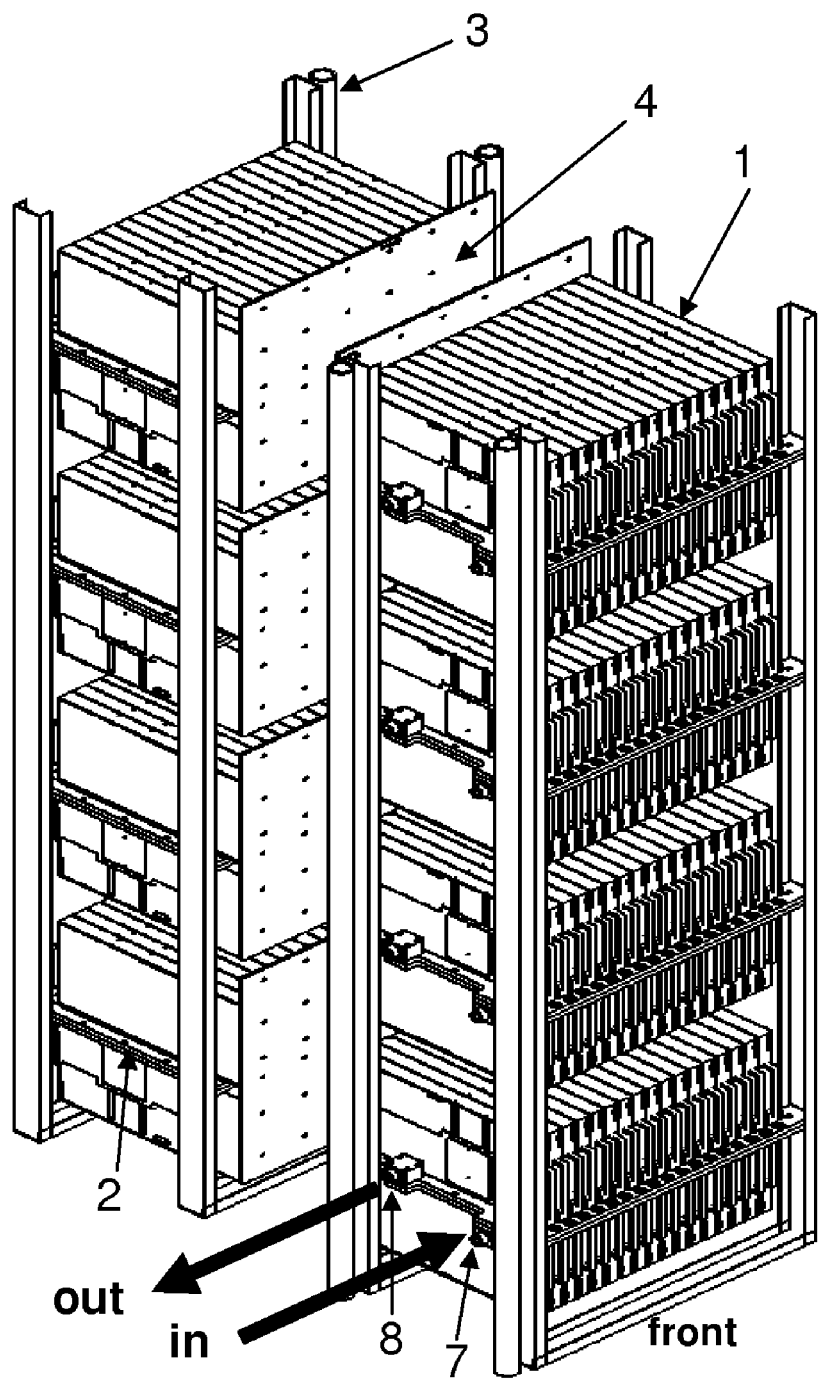
FIG. 6 illustrates an electronics rack with a plurality of systems for cooling processor nodes according to the invention.

In FIG. 6 is shown an example of a super computer consisting on eight cooling plates 2, each four in an electronics rack. Four are in the front and four are in the back. On each cooling plate sit 32 processor nodes and two controller nodes. The controller nodes have a similar housing as the processor nodes. They sit in the middle position on each side of the cooling plates 2. The two manifolds which supply the cooling plates 2 with liquid coolant (water) are not shown. They are mounted on the side of the rack at the front and at the back. The liquid coolant gets into the cooling plates 2 via the inlet connector 7 to leave them via outlet connector 8 carrying heat outside the cooling plates.

Although the present invention is described with this example, it will be evident that various modifications and changes may be made to these embodiments without departing from the broader spirit and scope of this invention. Accordingly the drawings are to be regarded in an illustrative rather than a restrictive sense.

| | References: |
|---|---|
| 1 | PCB or processor node; |
| 2 | cooling plate; |
| 3 | profile; |
| 4 | back plane; |
| 5 | holes; |
| 6 | screw; |
| 7 | inlet connector; |
| 8 | outlet connector; |
| 9 | ends of the cooling plate 2; |
| 10 | housing; |
| 11 | lever; |
| 12 | pusher; |
| 13 | pressure screw; |
| 14 | wedge; |
| 15 | spring; |
| 16 | nut; |
| 18 | base portion of the housing; |

What is claimed is:

1. A system for cooling processor assembly, comprising:
   printed circuit boards (PCB) with a plurality of heat emitting electronic components;
   a housing for each PCB with a heat sink covering at least partly the heat emitting electronic components while the housing comprises a base portion to which are transferred heat emitted by the electronic components; and
   a cooling plate on which are fixed in series the different PCBs by directly positioning the base portion of the housings onto the cooling plate;
   wherein the housings include at their base portions clamps to be inserted into corresponding guiding holes of the cooling plate when a PCB together with its housing is positioned onto the cooling plate at a specific dedicated place defined by the guiding holes such that the PCB together with its housing is pressed against the cooling plate alongside the base portion when fixed onto the cooling plate allowing thermal coupling between the housing and the cooling plate and a hot plugging of the PCB onto the cooling plate without requiring to interrupt the cooling process applied to the cooling plate.

2. The cooling system according to claim 1 wherein the clamps are pressured screws protruding from the base portion of the housings and activated by a clamping mechanism comprising a lateral lever on the housing driving a pusher alongside the base portion acting on the pressured screws while the activation of the lever after positioning the PCB releases the screws pulled by some spring mechanism into the housing resulting by pressing the PCB together with its housing against the cooling plate alongside the base portion locking the PCB onto the cooling plate.

3. The cooling system according to claim 1 while the cooling plate being partly hollow with internal manifolds for a liquid distribution to carry out heat transferred from the base portion of the housing to the cooling plate.

4. The cooling system according to claim 1 wherein the cooling plate is constructed in a strong enough way to act as holder for the PCBs with their housings.

5. The cooling system according to claim 1 wherein the PCBs with their housings are hung in the cooling plate such that the cooling plate cools only with its bottom side.

6. The cooling system according to claim 1 wherein the base portion of the housing to be pressed against the cooling plate is covered with some thermal interface material.

7. The cooling system according to claim 1 wherein the cooling plate comprises guiding holes on both sides allowing fixing in series PCBs with their respective housing on both sides.

8. The cooling system according to claim 2 wherein the spring mechanism pulling the screws is a spring surrounding each screw.

9. The cooling system according to claim 8 wherein the pressure exerted by the base portion of the housing on the cooling plate achieved by the spring onto the screw is adaptable by adjusting the protruding height of the screws in comparison to the base portion.

10. An electronics rack with a plurality of systems for cooling processor assembly, each comprising:
    printed circuit boards (PCB) with a plurality of heat emitting electronic components;
    a housing for each PCBs with a heat sink covering at least partly the heat emitting electronic components while the housing comprises a base portion to which are transferred heat emitted by the electronic components; and
    a cooling plate on which are fixed in series the different PCBs by directly positioning the base portion of the housings onto the cooling plate;
    wherein the housings include at their base portions clamps to be inserted into corresponding guiding holes of the cooling plate when a PCB together with its housing is positioned onto the cooling plate at a specific dedicated place defined by the guiding holes such that the PCB together with its housing is pressed against the cooling plate alongside the base portion when fixed onto the cooling plate allowing thermal coupling between the housing and the cooling plate and a hot plugging of the PCB onto the cooling plate without requiring to interrupt the cooling process applied to the cooling plate.

11. The electronics rack according to claim 10 wherein the clamps are pressured screws protruding from the base portion of the housings and activated by a clamping mechanism comprising a lateral lever on the housing driving a pusher alongside the base portion acting on the pressured screws while the activation of the lever after positioning the PCB releases the screws pulled by some spring mechanism into the housing resulting by pressing the PCB together with its housing against the cooling plate alongside the base portion locking the PCB onto the cooling plate.

12. The electronics rack according to claim 10 while the cooling plate being partly hollow with internal manifolds for liquid distribution to carry out heat transferred from the base portion of the housing to the cooling plate.

13. The electronic rack according to claim 10 wherein the cooling plate is constructed in a strong enough way to act as holder for the PCBs with their housings.

14. The electronic rack according to claim 10 wherein the PCBs with their housings are hung in the cooling plate such that the cooling plate cools only with its bottom side.

15. A method for cooling processor assembly comprising printed circuit boards (PCB) with a plurality of heat emitting electronic components; a housing for each PCBs with a heat sink covering at least partly the heat emitting electronic components while the housing comprises a base portion with clamps to which are transferred heat emitted by the electronic components; and a cooling plate, the method comprising:

positioning the base portion of the housings in series onto the cooling plate by inserting the respective clamps into corresponding guiding holes of the cooling plate such that by pressing the PCB together with its housing against the cooling plate alongside the base portion when fixed onto the cooling plate a thermal coupling is achieved between the housing and the cooling plate allowing a hot plugging of the PCB onto the cooling plate without requiring to interrupt the cooling process applied to the cooling plate.

16. The method according to claim 15 further comprises the step of fixing the PCB together with its housing on the cooling plate by activating some clamping mechanism via a lateral lever on the housing driving a pusher alongside the base portion acting on the clamps being pressured screws protruding from the base portion of the housings while the activation of the lever after positioning the PCB releases the screws pulled by some spring mechanism into the housing resulting by pressing the PCB together with its housing against the cooling plate alongside the base portion locking the PCB onto the cooling plate.

17. The method according to claim 15 further comprises the step of carrying out heat transferred from the base portion of the housing to the cooling plate by providing some liquid to be distributed within the cooling plate being partly hollow with manifolds.

\* \* \* \* \*